(12) United States Patent
Kim et al.

(10) Patent No.: US 10,756,703 B2
(45) Date of Patent: Aug. 25, 2020

(54) BULK ACOUSTIC WAVE RESONATOR

(71) Applicant: SAMSUNG ELECTRO-MECHANICS CO., LTD., Suwon-si (KR)

(72) Inventors: Tae Yoon Kim, Suwon-si (KR); Tae Kyung Lee, Suwon-si (KR); Sung Min Cho, Suwon-si (KR); Sang Kee Yoon, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 622 days.

(21) Appl. No.: 15/635,551

(22) Filed: Jun. 28, 2017

(65) Prior Publication Data
US 2018/0054182 A1   Feb. 22, 2018

(30) Foreign Application Priority Data

Aug. 18, 2016  (KR) .................. 10-2016-0104946
Nov. 28, 2016  (KR) .................. 10-2016-0159469

(51) Int. Cl.
*H01L 41/053* (2006.01)
*H01L 41/09* (2006.01)
*H03H 9/17* (2006.01)
*H03H 9/02* (2006.01)

(52) U.S. Cl.
CPC ........ *H03H 9/173* (2013.01); *H03H 9/02133* (2013.01); *H03H 9/174* (2013.01)

(58) Field of Classification Search
CPC ..... H03H 9/173; H03H 9/02135; H03H 9/174

USPC .................................................. 310/311–371
See application file for complete search history.

(56) References Cited

U.S. PATENT DOCUMENTS

| | | | |
|---|---|---|---|
| 6,355,498 B1 | 3/2002 | Chan et al. | |
| 8,692,631 B2 | 4/2014 | Zhang | |
| 9,219,464 B2 * | 12/2015 | Choy | B81B 7/02 |
| 9,246,473 B2 | 1/2016 | Burak et al. | |
| 2003/0227338 A1 * | 12/2003 | Kawakubo | H03H 9/0095 331/107 A |
| 2007/0057599 A1 | 3/2007 | Motai et al. | |
| 2007/0194863 A1 | 8/2007 | Shibata et al. | |
| 2008/0081398 A1 | 4/2008 | Lee et al. | |
| 2010/0013032 A1 * | 1/2010 | Oppermann | H01L 21/56 257/415 |
| 2013/0292855 A1 * | 11/2013 | Oppermann | H01L 21/56 257/778 |
| 2014/0118087 A1 | 5/2014 | Burak et al. | |

(Continued)

FOREIGN PATENT DOCUMENTS

| | | |
|---|---|---|
| CN | 1929302 A | 3/2007 |
| CN | 101026368 A | 8/2007 |
| CN | 105048986 A | 11/2015 |

OTHER PUBLICATIONS

Chinese Office Action dated July 17, 2020 in corresponding Chinese Patent Application No. 201710703795.6 (10 pages in Chinese).

*Primary Examiner* — Thomas M Dougherty
(74) *Attorney, Agent, or Firm* — NSIP Law

(57) ABSTRACT

A bulk acoustic wave resonator includes: a support part disposed on a substrate; a layer disposed on the support part, wherein an air cavity is formed between the support part, the substrate and the layer; and a frame extending along the layer, within the air cavity, and spaced apart from the support part.

19 Claims, 14 Drawing Sheets

(56) References Cited

U.S. PATENT DOCUMENTS

| | | |
|---|---|---|
| 2014/0191825 A1 | 7/2014 | Son et al. |
| 2015/0280687 A1 | 10/2015 | Burak et al. |
| 2015/0318837 A1 | 11/2015 | Zou et al. |
| 2016/0308509 A1* | 10/2016 | Burak .................... H03H 9/173 |

* cited by examiner

BULK ACOUSTIC WAVE RESONATOR

CROSS-REFERENCE TO RELATED APPLICATIONS

This application claims benefit of Korean Patent Application Nos. 10-2016-0104946 and 10-2016-0159469 filed on Aug. 18, 2016 and Nov. 28, 2016, respectively, in the Korean Intellectual Property Office, the entire disclosures of which are incorporated herein by reference for all purposes.

BACKGROUND

1. Field

The following description relates to a bulk acoustic wave resonator.

2. Description of Related Art

Recently, in accordance with the rapid development of mobile communications devices, and chemical and biological devices, for example, demand for a small and light filter, oscillator, resonant element, and acoustic resonant mass sensor used in these devices has increased.

A bulk acoustic wave resonator is a known device for implementing such a small and light filter, oscillator, resonant element, and acoustic resonant mass sensor. The bulk acoustic wave resonator may be mass-produced at minimal cost, and may be implemented to have a subminiature size. In addition, the bulk acoustic resonator may implement a high quality factor (Q) value, which is a main characteristic of a filter, may be used in the microwave frequency band, and, particularly, may also implement bands of a personal communications system (PCS) and a digital cordless system (DCS).

The bulk acoustic wave resonator includes a resonant part implemented by sequentially stacking a lower electrode, a piezoelectric layer, and an upper electrode on a substrate. When electrical energy is applied to the upper and lower electrodes to induce an electric field in the piezoelectric layer, the electric field generates a piezoelectric phenomenon in the piezoelectric layer to allow the resonant part to vibrate in a predetermined direction. As a result, acoustic waves are generated in the same direction as the direction in which the resonant part vibrates, resulting in resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes: a support part disposed on a substrate; a layer disposed on the support part, wherein an air cavity is formed between the support part, the substrate and the layer; and a frame extending along a boundary surface of the layer, within the air cavity, and spaced apart from the support part.

The layer may include a resonant part including a first electrode, a piezoelectric layer, and a second electrode.

The frame may extend along the boundary surface, within the air cavity, in an inactive region of the resonant part.

The frame may extend along the boundary surface, within the air cavity, at an edge of an active region of the resonant part.

The frame may be formed of a material including any one or both of compressive stress and tensile stress.

The frame may include a temperature coefficient of elasticity having a polarity that is different from a polarity of a temperature coefficient of elasticity of the resonant part.

The bulk acoustic wave resonator may further include an auxiliary electrode disposed on the second electrode at an edge of an active region of the resonant part.

The second electrode may have an acoustic impedance that is different than an acoustic impedance of the auxiliary electrode.

In another general aspect, a bulk acoustic wave resonator includes: a support part disposed on a substrate; a layer disposed on the support part, wherein an air cavity is formed between the support part, the substrate and the layer; and a frame extending along a boundary surface of the layer, within the air cavity, wherein a width of an upper surface of the frame is greater than a width of a lower surface of the frame, and wherein side surfaces of the frame connecting the upper surface and the lower surface to each other are inclined.

The layer may include a resonant part including a first electrode, a piezoelectric layer, and a second electrode.

The frame may extend along the boundary surface, within the air cavity, in contact with the support part in an inactive region of the resonant part.

The frame may extend along the boundary surface, within the air cavity, in contact with the support part at an edge of an active region of the resonant part.

The layer may further include a membrane disposed between the resonant part and the air cavity.

The support part may include a first support part and a second support part sequentially disposed in a direction away from the air cavity. The membrane may be further disposed at a boundary between the air cavity and the frame, a boundary between the air cavity and the first support part, a boundary between the first support part and the second support part, a boundary between the frame and the second support part, and an upper surface of the second support part.

The support part may include a first support part and a second support part sequentially disposed in a direction away from the air cavity, wherein the first support part is formed of a material that is different than a material of the second support part.

The frame may extend along the boundary surface, within the air cavity, and may penetrate through portions of the first support part and the second support part.

A thickness of the first support part and a thickness of the second support part may be the same as a thickness of the air cavity.

An angle formed by the lower surface and the side surface may be 110° to 160°.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
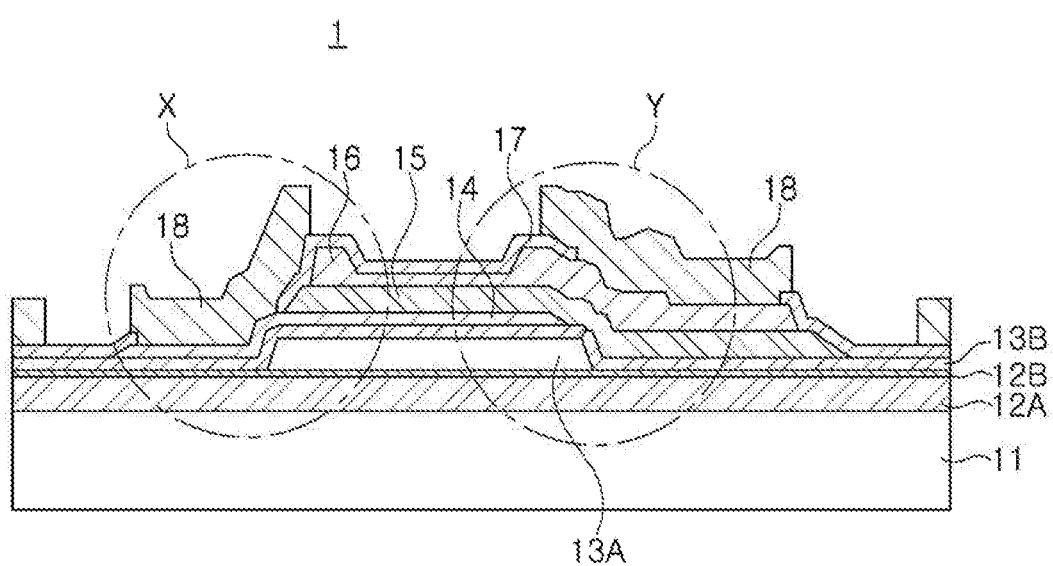
FIG. 1 is a cross-sectional view illustrating an example of a bulk acoustic wave resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2A:
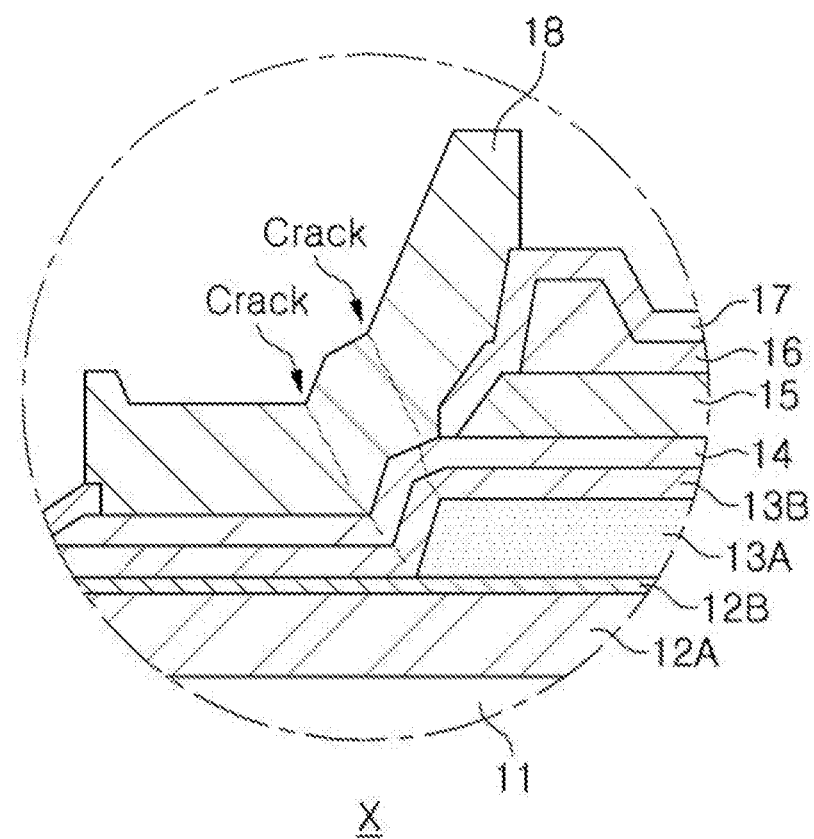
FIGS. 2A and 2B are partially enlarged views of the bulk acoustic wave resonator of FIG. 1.
Figure 2B:
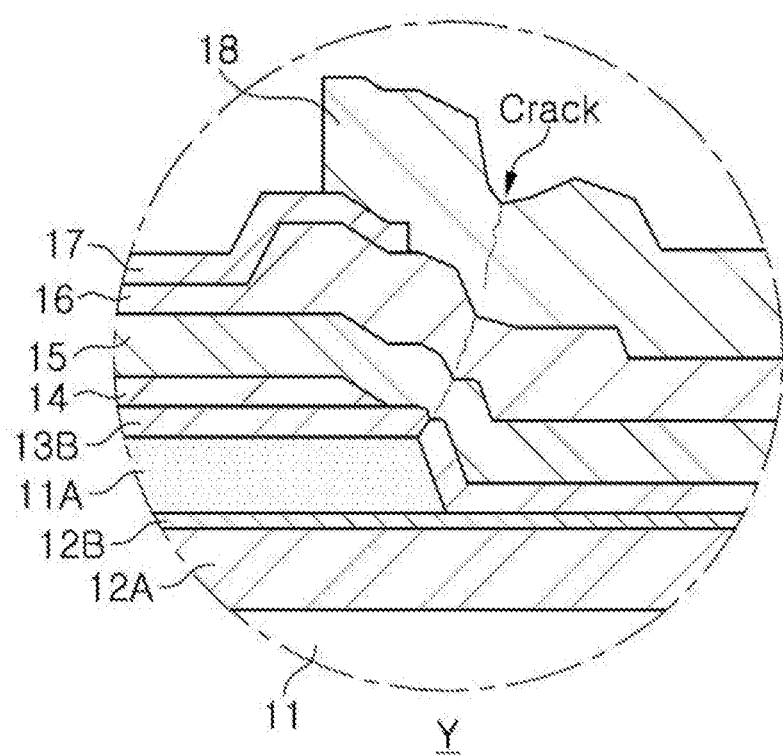

FIG. 1 is a cross-sectional view illustrating an example of a bulk acoustic wave resonator 1, and FIGS. 2A and 2B are partially enlarged views of the bulk acoustic wave resonator 1.

Referring to FIG. 1, the bulk acoustic wave resonator 1 includes a substrate 11, an insulating layer 12A electrically isolating the substrate 11, an etch stop layer 12B protecting the insulating layer 12A from an etching process, an air cavity 13A formed on the etch stop layer 12B, a membrane 13B covering the air cavity 13A, and a lower electrode 14, a piezoelectric layer 15, and an upper electrode 16 sequentially stacked on the membrane 13B. In addition, the bulk acoustic wave resonator 1 includes a protective layer 17 preventing the upper electrode 16 from being externally exposed and an electrode pad 18 configured to apply electrical signals to the lower electrode 14 and the upper electrode 16.

The air cavity 13A is positioned below a resonant part including the lower electrode 14, the piezoelectric layer 15, and the upper electrode 16 so that the resonant part vibrates in a predetermined direction. The air cavity 13A may be formed by forming a sacrificial layer on the etch stop layer 12B, forming the membrane 13B on the sacrificial layer, and then removing the sacrificial layer by an etching process.

The air cavity 13A may have an approximately trapezoidal shape. Referring to FIGS. 2A and 2B, cracks may form in the lower electrode 14, the piezoelectric layer 15, the upper electrode 16, and the electrode pad 18 stacked on the membrane 13B due to a height of the air cavity 13A and an angle of a side surface of the air cavity 13A. In addition, crystals of the piezoelectric layer 15 stacked on the membrane 13B may grow abnormally. Due to the formation of the cracks and the abnormal growth of the crystals, insertion loss characteristics and attenuation characteristics of the bulk acoustic wave resonator 1 may be deteriorated.

FIGS. 3 through 10 are cross-sectional views illustrating respective bulk acoustic wave resonators 10, 10a, 10b, 10c, 10d, 10e, 10f, and 10g, according to various embodiments.

Figure 3:
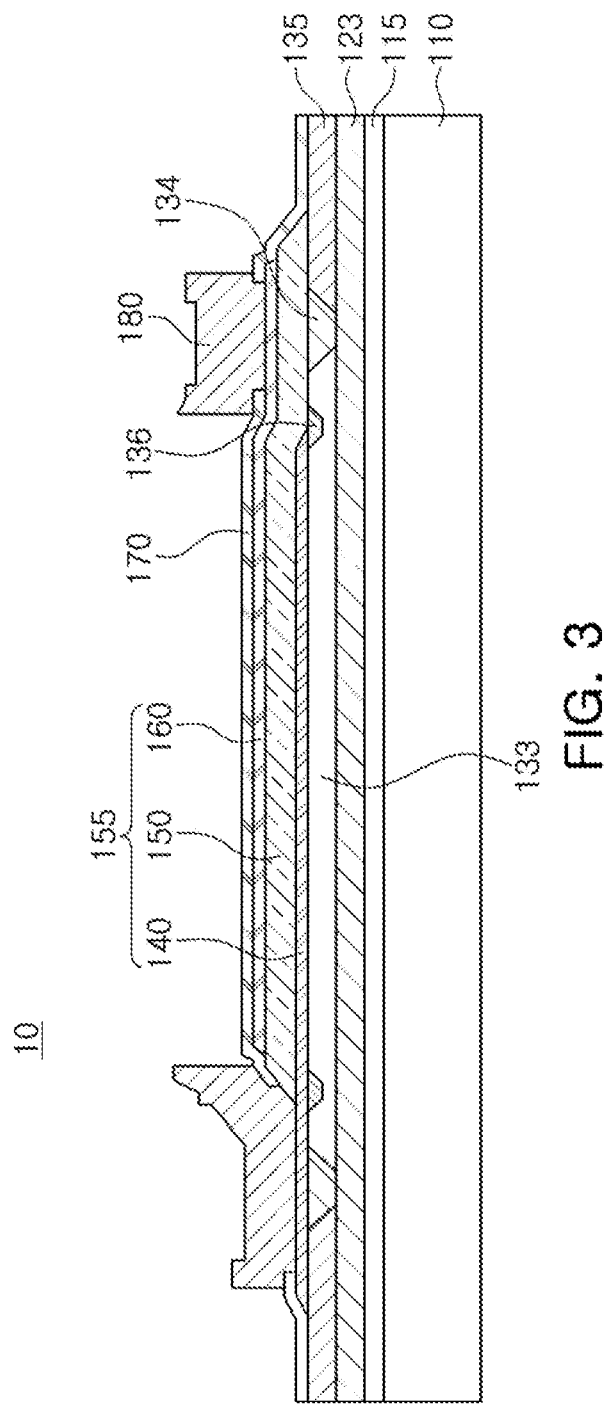
FIGS. 3 through 10 are cross-sectional views illustrating bulk acoustic wave resonators according to various embodiments.

The example bulk acoustic wave resonators 10 illustrated in FIGS. 3 through 10 are similar to one another, and, thus, the bulk acoustic wave resonator 10 illustrated in FIG. 3 will be mainly described. In the bulk acoustic wave resonators according to the embodiments illustrated in FIGS. 4 through 10, a description of contents that are the same as or overlap those of the bulk acoustic wave resonator 10 will be omitted, and contents different from those of the bulk acoustic wave resonator 10 will be primarily described.

Referring to FIG. 3, the bulk acoustic wave resonator 10 is a film bulk acoustic resonator (FBAR). The bulk acoustic wave resonator 10 includes a substrate 110, an insulating layer 115, an etch stop layer 123, an air cavity 133, a first support part 134, a second support part 135, a frame 136, and a resonant part 155 including a first electrode 140, a piezoelectric layer 150, a second electrode 160, a protective layer 170, and an electrode pad 180.

The substrate 110 may be a silicon substrate, and the insulating layer 115 is provided on an upper surface of the substrate 110 to electrically isolate the resonant part 155 from the substrate 110. The insulating layer 115 may be formed on the substrate 110 by performing chemical vapor deposition, radio frequency (RF) magnetron sputtering, or evaporation of silicon dioxide ($SiO_2$) or aluminum oxide ($Al_2O_3$).

The etch stop layer 123 is formed on the insulating layer 115. The etch stop layer 123 protects the substrate 110 and the insulating layer 115 from an etching process, and is a base for depositing layers or films on the etch stop layer 123.

The air cavity 133, the first support part 134, and the second support part 135 are formed on the etch stop layer 123. The air cavity 133, the first support part 134, and the second support part 135 may be formed at the same height, such that one surface provided by the air cavity 133, the first support part 134, and the second support part 135 is approximately flat. The insulating layer 115 and the etch stop layer 123 are separated from each other in FIG. 3, but the insulating layer 115 and the etch stop layer 123 may be integrated with each other as a single layer. The insulating layer 115 and the etch stop layer 123 may be integrated with each other using an oxide layer.

The resonant part 155 includes the first electrode 140, the piezoelectric body 150, and the second electrode 160. A common region in which the first electrode 140, the piezoelectric layer 150, and the second electrode 160 overlap one another in a vertical direction is positioned above the air cavity 133. The first electrode 140 and the second electrode 160 may be formed of any one of gold (Au), titanium (Ti), tantalum (Ta), molybdenum (Mo), ruthenium (Ru), platinum (Pt), tungsten (W), aluminum (Al), iridium (Ir), and nickel (Ni), or alloys thereof. The piezoelectric layer 150, which generates a piezoelectric effect that electrical energy is converted into mechanical energy having an elastic wave form, may be formed of any one of aluminum nitride (AlN), zinc oxide (ZnO), and lead zirconium titanium oxide (PZT; PbZrTiO). In addition, the piezoelectric layer 150 may further include a rare earth metal. As an example, the rare earth metal includes at least one of scandium (Sc), erbium (Er), yttrium (Y), and lanthanum (La). The piezoelectric layer 150 may include 1 to 20 at % of rare earth metal. Although not illustrated in detail, a seed layer for improving crystal alignment of the piezoelectric layer 150 may be additionally disposed below the first electrode 140. The seed layer may be formed of any one of aluminum nitride (AlN), zinc oxide (ZnO), and lead zirconium titanium oxide (PZT; PbZrTiO) having the same crystallinity as that of the piezoelectric layer 150.

The resonant part 155 includes an active region and an inactive region. The active region of the resonant part 155, which is a region that vibrates and resonates in a predetermined direction due to a piezoelectric phenomenon generated in the piezoelectric layer 150 when electrical energy such as a radio frequency signal is applied to the first electrode 140 and the second electrode 160, is a region in which the first electrode 140, the piezoelectric layer 150, and the second electrode 160 overlap with one another in the vertical direction above the air cavity 133. The inactive region of the resonant part 155, which is a region that does not resonate by the piezoelectric phenomenon even when the electrical energy is applied to the first and second electrodes 140 and 160, is a region outside the active region.

The resonant part 155 outputs a radio frequency signal having a specific frequency using the piezoelectric phenomenon. In detail, the resonant part 155 outputs a radio frequency signal having a resonant frequency corresponding to vibrations depending on the piezoelectric phenomenon of the piezoelectric layer 150.

When the electrical energy is applied to the first electrode 140 and the second electrode 160, an acoustic wave is generated by the piezoelectric phenomenon generated in the piezoelectric layer 150. In this case, a lateral wave is collaterally generated from the generated acoustic wave. When the collaterally generated lateral wave is not trapped, loss of the acoustic wave may occur to deteriorate a quality factor of the resonator.

Figure 4:
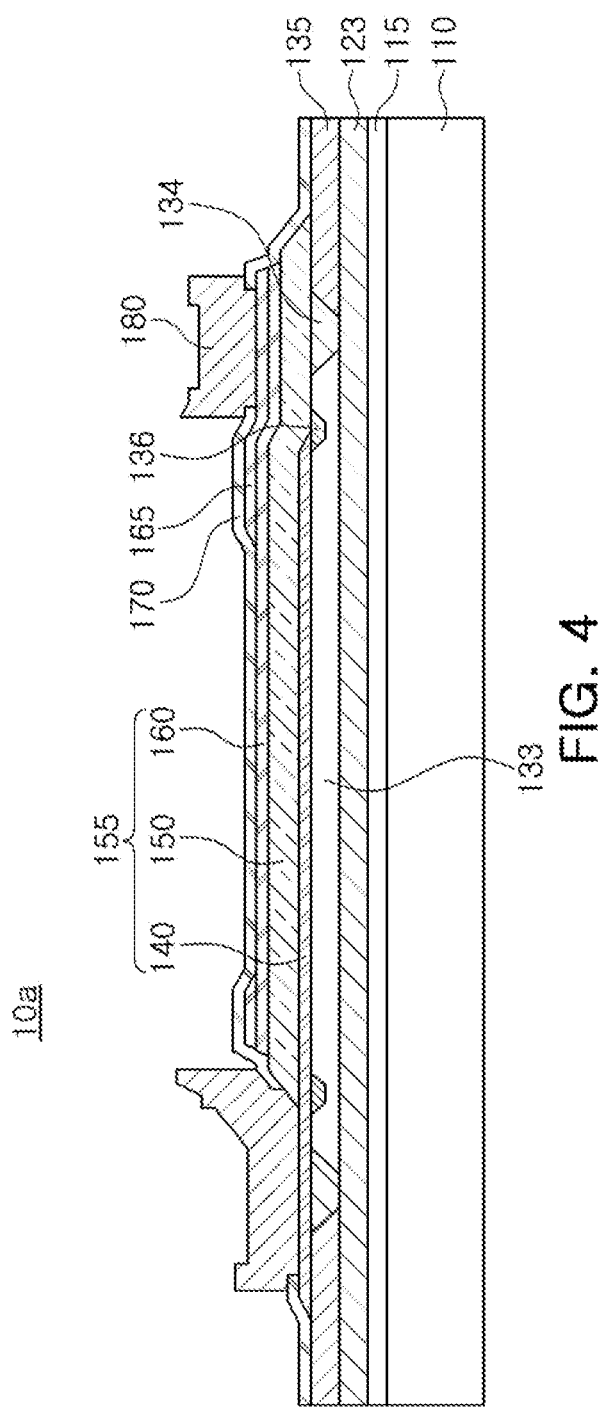

Referring to FIG. 4, in a bulk acoustic wave resonator 10a, according to an embodiment, an auxiliary electrode 165 is provided along an edge of the active region of the resonant part 155. The edge of the active region refers to a portion in the active region adjacent to a boundary between the active region and the inactive region. The auxiliary electrode 165 may be formed of the same material as that of the second electrode 160.

Alternatively, the auxiliary electrode 165 may be formed of a material different from that of the second electrode 160. In detail, the auxiliary electrode 165 and the second electrode 160 may have different acoustic impedances. For example, the auxiliary electrode 165 is formed of a material having an acoustic impedance higher than that of the second electrode 160. As an example, when the second electrode 160 is formed of ruthenium (Ru), the auxiliary electrode 165 is formed of one of iridium (Ir) and tungsten (W) having an acoustic impedance higher than that of ruthenium (Ru). Alternatively, the auxiliary electrode 165 may be formed of a material having an acoustic impedance lower than that of the second electrode 160. As an example, when the second electrode 160 is formed of ruthenium (Ru), the auxiliary electrode 165 is formed of one of aluminum (Al), gold (Au), nickel (Ni), copper (Cu), titanium (Ti), chromium (Cr), cobalt (Co), manganese (Zn), and magnesium (Mg) having an impedance lower than that of ruthenium (Ru), and is formed of one of aluminum (Al), gold (Au), nickel (Ni), copper (Cu), cobalt (Co), manganese (Zn), and magnesium (Mg) when considering electrical resistivity.

According to the embodiment illustrated in FIG. 4, the auxiliary electrode 165 is additionally provided along the edge of the active region of the resonant part 155 to trap a lateral wave. Therefore, a quality factor of the bulk acoustic wave resonator 10a is improved, and loss of an acoustic wave may be reduced. A configuration of the auxiliary electrode 165 of the bulk acoustic wave resonator 10a illustrated in FIG. 4 may be variously applied to other embodiments disclosed herein.

Again referring to FIG. 3, the air cavity 133 is positioned below the resonant part 155 including the first electrode 140, the piezoelectric layer 150, and the second electrode 160 so that the resonant part 155 may vibrate in a predetermined direction. The air cavity 133 is formed by forming a sacrificial layer on the etch stop layer 123, stacking the first electrode 140, the piezoelectric layer 150, the second electrode 160, and the like, on the sacrificial layer, and then etching and removing the sacrificial layer by an etching process. In an example, the sacrificial layer includes polysilicon (poly-Si).

Figure 5:
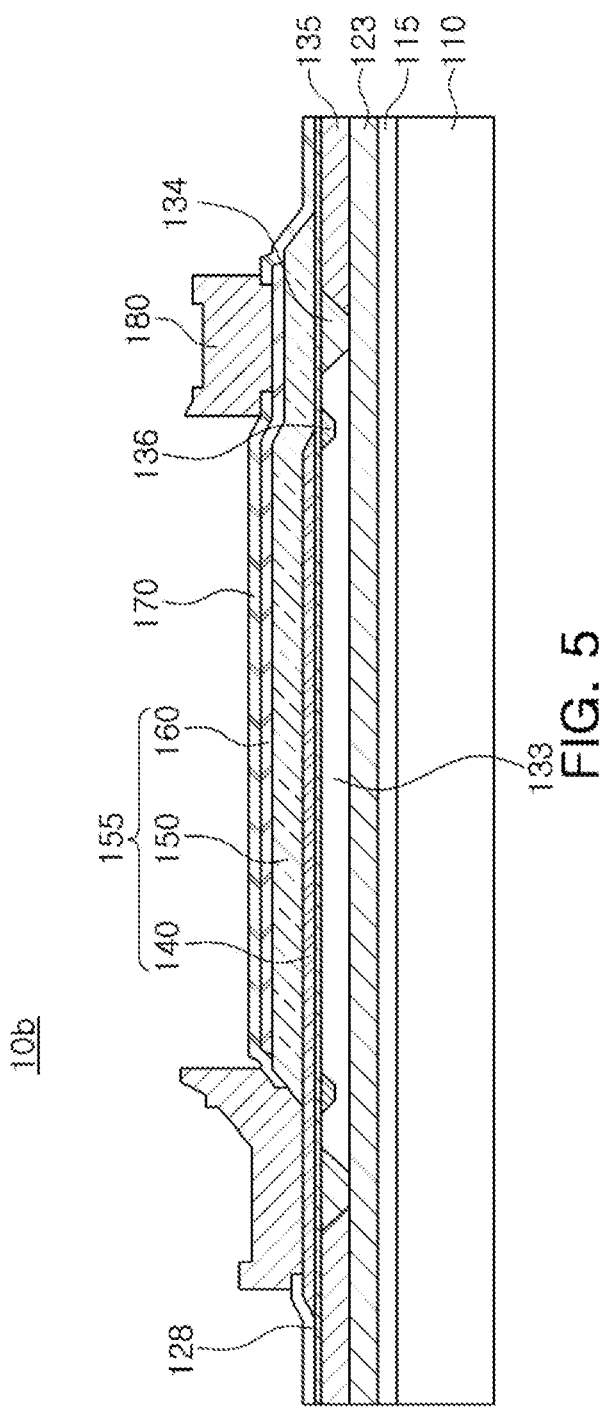
Figure 6:
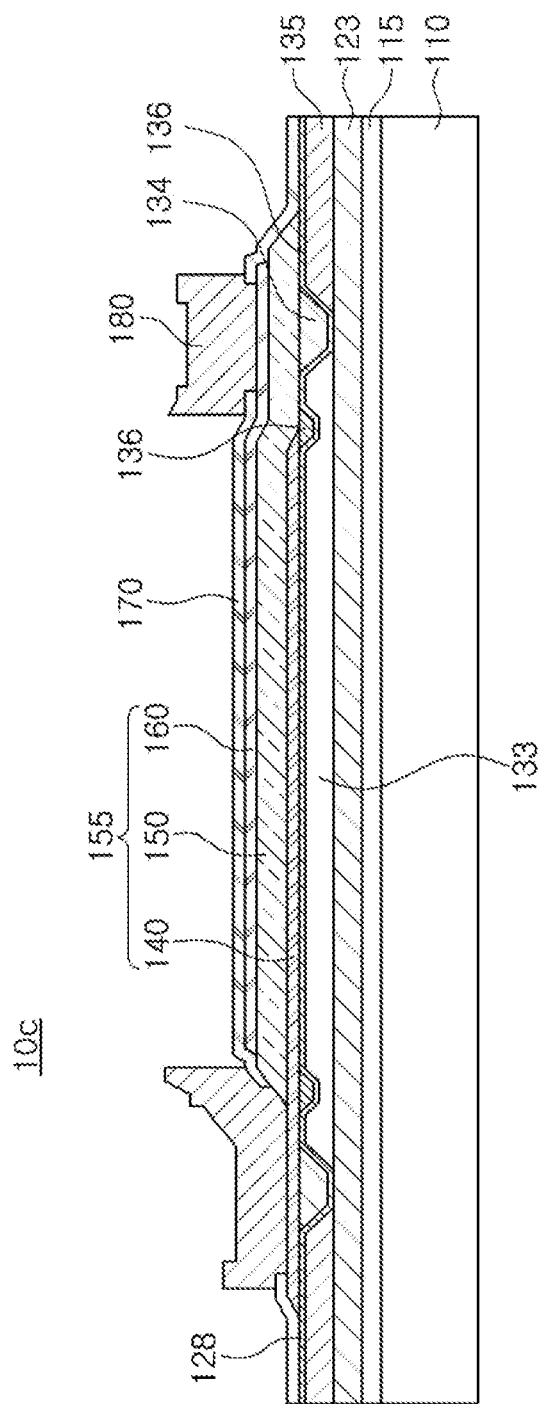
Figure 7:
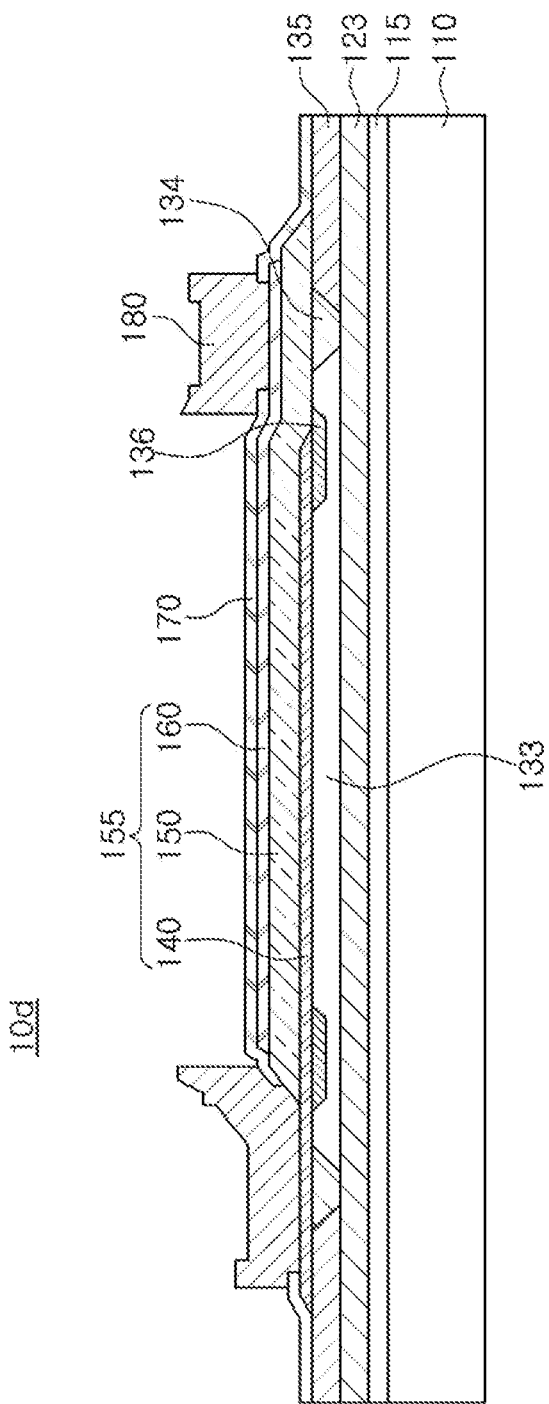

Referring to FIGS. 5 and 6, in bulk acoustic wave resonators 10b and 10c, a membrane 128 is additionally provided between the air cavity 133 and the resonant part 155. The membrane 128 adjusts stress of the bulk acoustic wave resonator 10b/10c, and is a stop layer of a planarization process of an etching stop material to be described below. As an example, the membrane 128 includes silicon nitride (SiN).

Referring to FIG. 5, in the bulk acoustic wave resonator 10b, the membrane 128 is formed on an approximately flat surface formed by the air cavity 133, the first support part 134, and the second support part 135 to adjust stress of the bulk acoustic wave resonator 10b. Referring to FIG. 6, in the bulk acoustic wave resonator 10c, the membrane 128 is formed at a boundary between the air cavity 133 and the resonant part 155, a boundary between the air cavity 133 and the frame 136, a boundary between the air cavity 133 and the first support part 134, a boundary between the first support part 134 and the etch stop layer 123, a boundary between the first support part 134 and the second support part 135, a boundary between the frame 136 and the second support part 135, and an upper surface of the second support part 135.

Again referring to FIG. 3, the first and second support parts 134 and 135 are formed laterally outside the air cavity 133. A thickness of each of the first and second support parts 134 and 135 may be the same as a thickness of the air cavity 133. An upper surface formed by the air cavity 133 and the first and second support parts 134 and 135 is flat. According to the disclosed embodiments, the resonant part 155 is disposed on a flat surface from which a step is removed, resulting in improvement of insertion loss characteristics and attenuation characteristics of the bulk acoustic wave resonator 10/10a/10b/10c/10d/10e/10f/10g.

The first support part 134 and the second support part 135 are sequentially disposed in a lateral direction away from the air cavity 133. The first support part 134 and the second support part 135 may be formed of different materials. For example, the first support part 134 is formed of a material that is not etched in an etching process for removing the sacrificial layer. The first support layer 134 may be formed of the same material as that of the etch stop layer 123. As an example, the first support part 134 is formed of one of silicon dioxide ($SiO_2$) and silicon nitride $Si_3N_4$. The second support part 135 corresponds to a portion of the sacrificial layer formed on the etch stop layer 123 that remains after the etching process. A cross section of the first support part 134 may have an approximately trapezoidal shape. For example, a width of an upper surface of the first support part 134 is greater than a width of a lower surface of the first support part 134, and side surfaces of the first support part 134 connecting the upper surface and the lower surface of the first support part 134 to each other are inclined.

The frame 136 extends in the air cavity 133 along a boundary surface of the one or more layers (e.g., the first electrode 140, the piezoelectric layer 150, the second electrode 160, and the protective layer 170) disposed on the air cavity 133. As described herein, the boundary surface is an innermost surface of the one or more layers that bounds the air cavity 133. The frame 136 may have a thickness that is less than a thickness of the first support part 134. A cross section of the frame 136 may have an approximately trapezoidal shape. For example, a width of an upper surface of the frame 136 is greater than a width of a lower surface of the frame 136, and side surfaces of the frame 136 connecting the upper surface of the frame 136 to the lower surface of the frame 136 to each other are inclined.

The frame 136 is disposed in at least one of the active region and the inactive region of the resonant part 155. When the frame 136 is disposed in the active region, the frame 136 may be disposed along the edge of the active region.

Referring to FIG. 3, in the bulk acoustic wave resonator 10, the frame 136 is spaced apart from the first support part 134, and extends in the air cavity 133 along the boundary surface of the resonant part 155 in the inactive region. Alternatively, in the bulk acoustic wave resonator 10d of FIG. 7, the frame 136 is spaced apart from the first support part 134, and extends in the air cavity 133 along the boundary surface between of the resonant part 155 at the edge of the active region.

Figure 8:
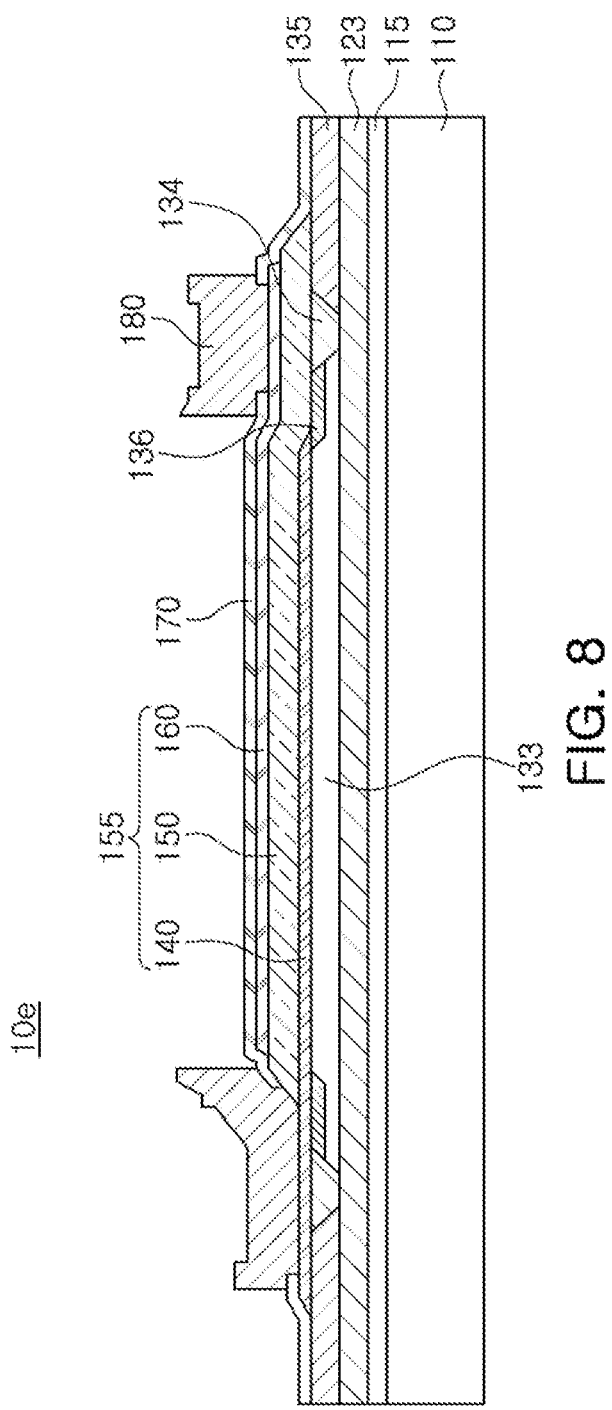
Figure 9:
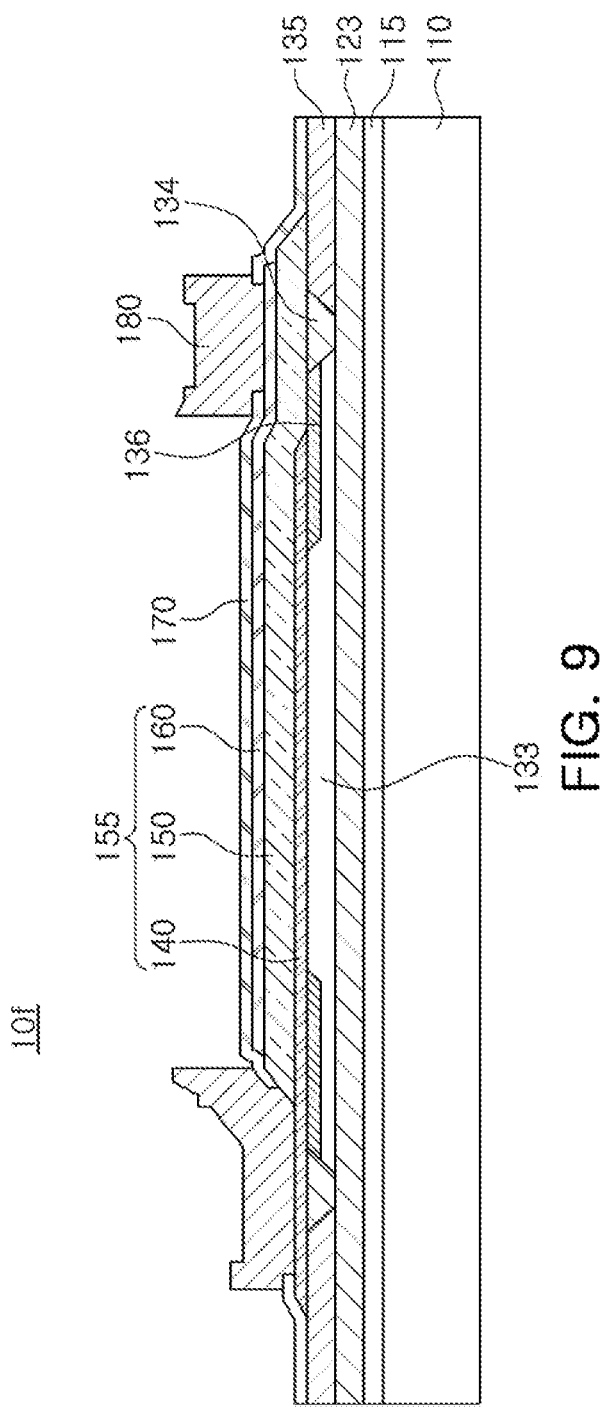

Referring to FIG. 8, in the bulk acoustic wave resonator 10e, the frame 136 extends in the cavity 133 along the boundary surface of the resonant part 155 in the inactive region, and is in contact with the first support part 134. Referring to FIG. 9, in the bulk acoustic wave resonator 10f, the frame 136 extends in the cavity 133 along the boundary surface of the resonant part 155 at the edge of the active region, and is in contact with the first support part 134.

Figure 10:
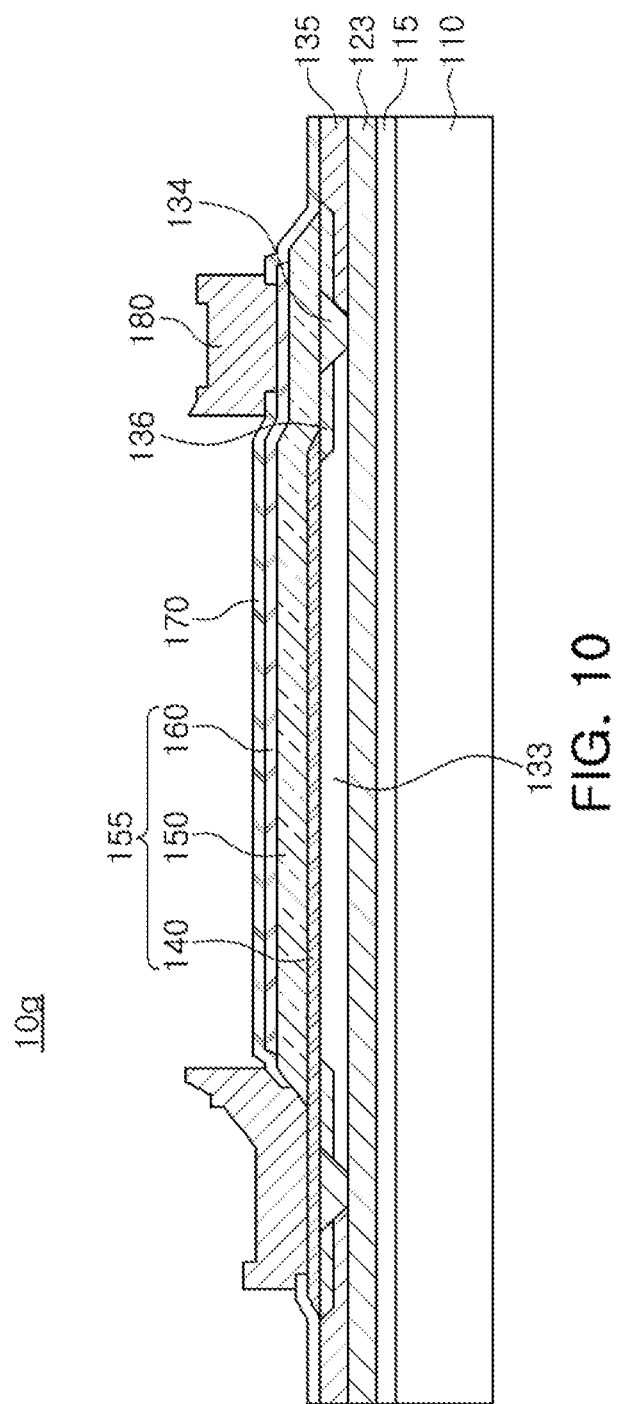

Alternatively, referring to FIG. 10, in the bulk acoustic wave resonator 10g, the frame 136 extends in the cavity 133 along the boundary surface of the resonant part 155, penetrates through the first support part 134, and protrudes toward the second support part 135. The frame 136, having a thickness that is less than a thickness of the first support part 134, protrudes from side surfaces of the first support part 134 toward the air cavity 133 and the second support part 135, which is stepped.

The frame 136 may be formed by the same process as the process of forming the first support part 134, and may be formed of the same material as the material of the first support part 134. As an example, the frame 136 is formed of any one of silicon dioxide ($SiO_2$) and silicon nitride ($Si_3N_4$).

According to the embodiments disclosed herein, the frame 136 is formed of a material having compressive stress and tensile stress, and the bulk acoustic wave resonator may thus be robust against stress acting in an upward direction and a downward direction of the bulk acoustic wave resonator 10/10a/10b/10c/10d/10e/10f/10g.

As an example, when the frame 136 is formed of a material having compressive stress, a phenomenon in which the resonant part 155 including the first electrode 140, the piezoelectric layer 150, and the second electrode 160 sags to a lower portion of the air cavity 133 may be prevented. In this case, the frame 136 may be formed of silicon dioxide ($SiO_2$). In addition, as another example, when the frame 136 is formed of a material having tensile stress, a phenomenon in which the resonant part 155 is bent toward a portion opposing the air cavity 133 may be prevented. In this case, the frame 136 may be formed of silicon nitride ($Si_3N_4$).

According to the disclosed embodiments, the frame 136 is formed of a material having an elastic coefficient that varies depending on a temperature (hereinafter, referred to as a temperature coefficient of elasticity) to reduce a variation in a frequency depending on a temperature change. As an example, a temperature coefficient of elasticity of the frame 136 and a temperature coefficient of elasticity of the resonant part 155 including the first electrode 140, the piezoelectric layer 150, and the second electrode 160 have different polarities. When the resonant part 155 has a negative temperature coefficient of elasticity of −30 to −80 ppm/K, in a case in which a temperature of the resonant part 155 rises by 1K, elasticity is reduced by 30 to 80 ppm. The reduction in the elasticity of the resonant part 155 causes a resonant frequency of the bulk acoustic wave resonator 10/10a/10b/10c/10d/10e/10f/10g to be lowered, which causes deterioration of performance of a filter including the bulk acoustic wave resonator 10/10a/10b/10c/10d/10e/10f/10g. In this case, when the frame 136 is formed of silicon dioxide ($SiO_2$) having a positive temperature coefficient of elasticity of 130 ppm/K, a reduction in elasticity due to an influence of the resonant part 155 is compensated for, and elasticity of the bulk acoustic wave resonator 10/10a/10b/10c/10d/10e/10f/10g increases depending on a rise in a temperature.

A case in which the frame 136 has a positive temperature coefficient of elasticity and the resonant part 155 has a negative temperature coefficient of elasticity is described above. However, the resonant part 155 may have a positive temperature coefficient of elasticity and the frame 136 may have a negative temperature coefficient of elasticity.

The protective layer 170 is formed on the second electrode 160 to prevent the second electrode 160 from being externally exposed. The protective layer 170 may be formed of any one of a silicon oxide based insulating material, a silicon nitride-based insulating material, and an aluminum nitride-based insulating material. The electrode pad 180 for applying the electrical signals to the first electrode 140 and the second electrode 160 is formed on the first electrode 140 and the second electrode 160, and is externally exposed.

FIGS. 11A through 11E are views illustrating processes of a method of manufacturing the bulk acoustic wave resonator 10.

Figure 11A:
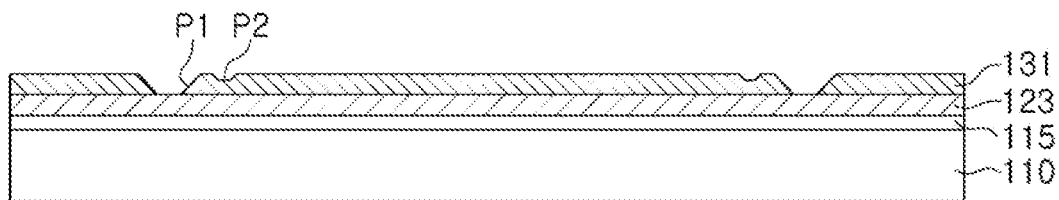
FIGS. 11A through 11E are views illustrating processes of a method of manufacturing the bulk acoustic wave resonator illustrated in FIG. 3, according to embodiments.

Referring to FIGS. 11A through 11E, the method of manufacturing the bulk acoustic wave resonator 10 begins with forming the substrate 110, the insulating layer 115, the etch stop layer 123, and the sacrificial layer 131, and forming a first pattern P1 and a second pattern P2 on the sacrificial layer 131 (see FIG. 11A). Portions of the etch stop layer 123 are exposed by the first pattern P1, which is thicker than the sacrificial layer 131, and the etch stop layer 123 is not exposed by the second pattern P2, which is thinner than the sacrificial layer 131.

Figure 11B:
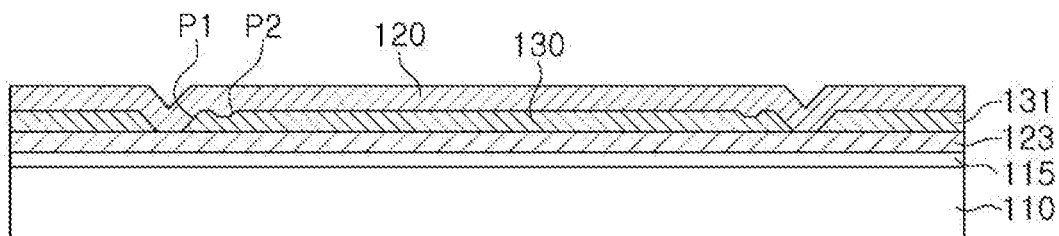

Referring to FIG. 11B, after the first pattern P1 and the second pattern P2 are formed on the sacrificial layer 131, an etching stop material 120 covering the sacrificial layer 131 and the etch stop layer 123 externally exposed by the first pattern P1 are formed. The first and second patterns P1 and P2 are filled by the etching stop material 120, and the etch stop layer 123 and the etching stop material 120 may be formed of the same material.

After the etching stop material 120 is formed, one surface of the etching stop material 120 is planarized so that the sacrificial layer 131 is externally exposed. In a process of planarizing the one surface of the etching stop material 120, portions of the etching stop material 120 are removed, and the first support part 134 and the frame 136 are formed by the etching stop material 120 remaining in the first pattern P1 and the second pattern P2 after portions of the etching stop material 120 are removed. As a result of the process of planarizing the one surface of the etching stop material 120, a surface formed by the sacrificial layer 131, the first support part 134, and the frame 136 is approximately flat.

Figure 11C:
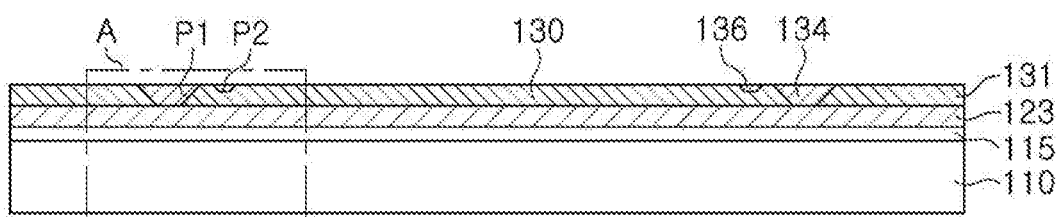
Figure 11D:
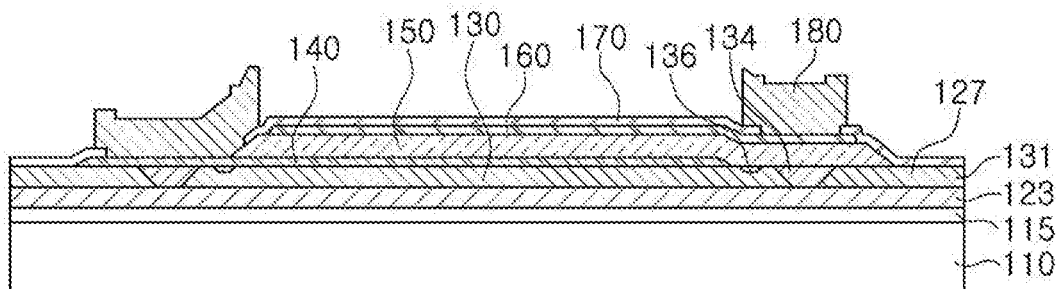
Figure 11E:
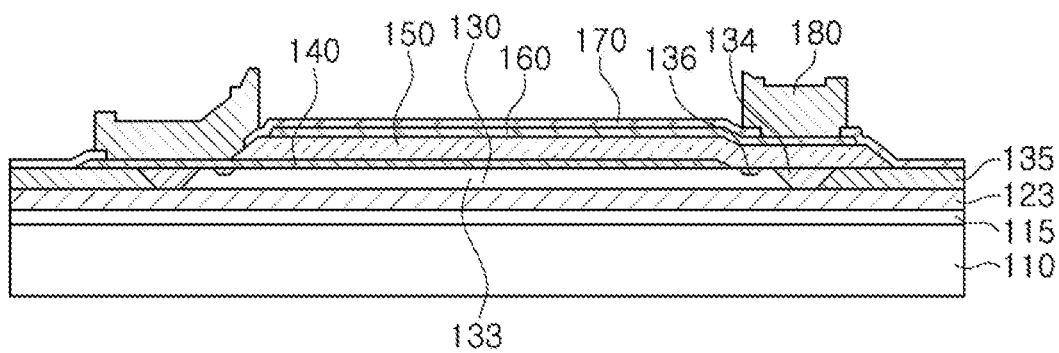
Figure 12:
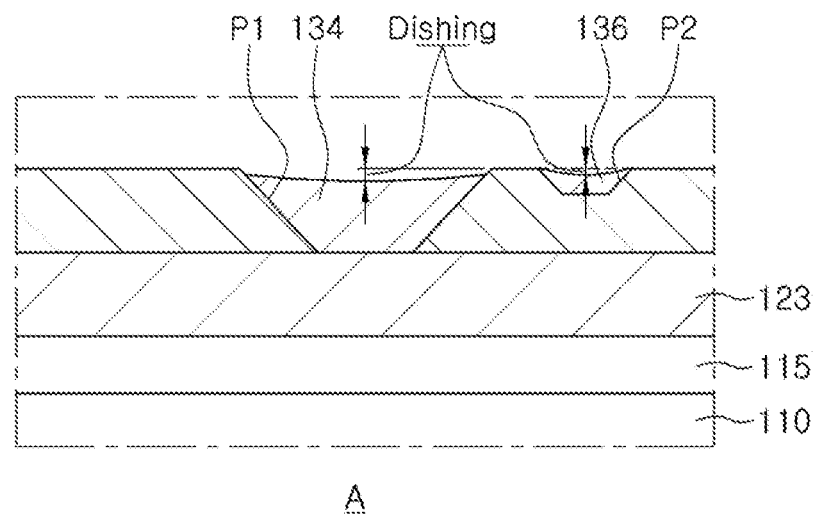
FIG. 12 is an enlarged view of part A of FIG. 11C.

FIG. 12 is an enlarged view of part A of FIG. 11C. Referring to FIG. 12, a dishing phenomenon in which upper surfaces of the first support part 134 and the frame 136 remaining after portions of the etching stop material 120 are removed are indented concavely by a step between the first pattern P1 and the second pattern P2 may occur. For example, a thickness of the center of the upper surfaces of the first support part 134 and the frame 136 is less than a thickness of an edge of the upper surfaces of the first support part 134 and the frame 136.

According to the disclosed embodiments, side surfaces of the first pattern P1 and the second pattern P2 in which the first support part 134 and the frame 136 are provided, respectively, are inclined to prevent an abrupt step from being formed on boundaries between the first support part 134 and the frame 136, and the sacrificial layer 131, and the first support part 134 may be formed so that a lower surface of the first support part 134 has a width that is less than a width of the upper surface of the first support part 134 to prevent occurrence of the dishing phenomenon. As an example, angles formed by the side surfaces and lower surfaces of the first pattern P1 and the second pattern P2 are 110° to 160°.

Again referring to FIGS. 11A through 11E, after portions of the etching stop material 120 are removed, the first electrode 140, the piezoelectric layer 150, and the second electrode 160 are sequentially stacked on an approximately flat surface formed by the first support part 134, the frame 136, and the sacrificial layer 131, the protective layer 170 is disposed on the second electrode 160, and the electrode pad 180 for applying the electrical signals to the first electrode 140 and the second electrode 160 is formed on the first electrode 140 and the second electrode 160 so as to be externally exposed (see FIG. 11D). Then, the portion of the sacrificial layer 131 that is disposed inside the first support part 134 is removed by an etching process, such that the air cavity 133 is formed, and the sacrificial layer 131 disposed outside the first support part 134 remains as the second support part 135 (see FIG. 11E).

Figure 13:
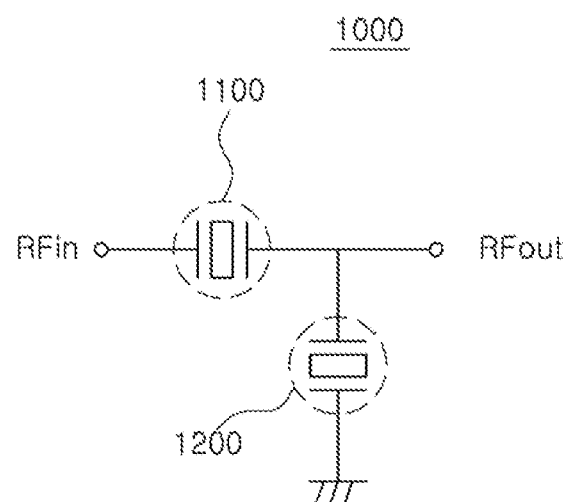
FIGS. 13 and 14 schematic circuit diagrams of filters, according to embodiments.
Figure 14:
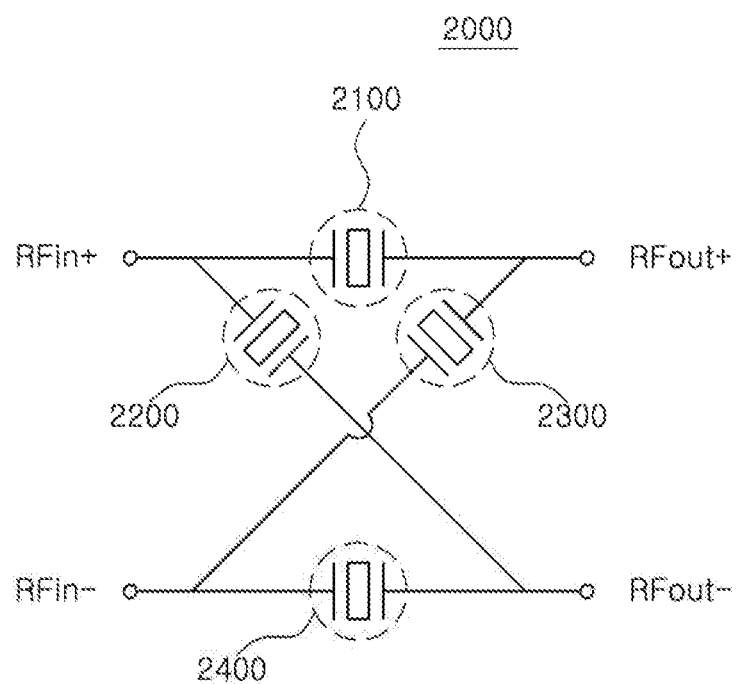

FIGS. 13 and 14 are schematic circuit diagrams of filters 1000 and 2000, respectively, according to embodiments. Bulk acoustic wave resonators 1100, 1200, 2100, 2200, 2300 and 2400 used in the filters of FIGS. 13 and 14 may correspond to the bulk acoustic wave resonators 10 through 10g according to the various embodiments disclosed herein.

Referring to FIG. 13, the filter 1000 is formed in a ladder type filter structure. In detail, the filter 1000 includes first and second bulk acoustic wave resonators 1100 and 1200.

The first bulk acoustic wave resonator 1100 is connected between a signal input terminal to which an input signal RFin is input and a signal output terminal from which an output signal RFout is output, in series, and the second bulk acoustic wave resonator 1200 is connected between the signal output terminal and a ground.

Referring to FIG. 14, a filter 2000 according to another embodiment is formed in a lattice type filter structure. In detail, the filter 2000 includes bulk acoustic wave resonators 2100, 2200, 2300, and 2400. The filter 2000 filters balanced input signals RFin+ and RFin−, and outputs balanced output signals RFout+ and RFout−.

As set forth above, in the bulk acoustic wave resonators according to the disclosed embodiments, formation of a crack in a film or a layer stacked on a substrate may be prevented, and normal growth of crystals may be induced.

In addition, in the bulk acoustic wave resonators according to the disclosed embodiments, a variation in a frequency depending on a temperature change is reduced, and the bulk acoustic wave resonator is robust with respect to stress acting in an upward direction and a downward direction.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator, comprising:
a support part disposed on a substrate;
a layer disposed on the support part, wherein an air cavity is formed between the support part, the substrate, and the layer; and
a frame extending along a boundary surface of the layer, within the air cavity, and spaced apart from the support part,
wherein a portion of the air cavity is disposed between a lower surface of the frame and an upper surface of the substrate.

2. The bulk acoustic wave resonator of claim 1, wherein the layer comprises a resonant part comprising a first electrode, a piezoelectric layer, and a second electrode.

3. The bulk acoustic wave resonator of claim 2, wherein the frame extends along the boundary surface, within the air cavity, at an inactive region of the resonant part.

4. The bulk acoustic wave resonator of claim 2, wherein the frame extends along the boundary surface, within the air cavity, at an edge of an active region of the resonant part.

5. The bulk acoustic wave resonator of claim 1, wherein the frame is formed of a material comprising any one or both of compressive stress and tensile stress.

6. The bulk acoustic wave resonator of claim 2, wherein the frame comprises a temperature coefficient of elasticity comprising a polarity that is different from a polarity of a temperature coefficient of elasticity of the resonant part.

7. The bulk acoustic wave resonator of claim 2, further comprising an auxiliary electrode disposed on the second electrode in an edge of an active region of the resonant part.

8. The bulk acoustic wave resonator of claim 7, wherein the second electrode comprises an acoustic impedance that is different than an acoustic impedance of the auxiliary electrode.

9. A bulk acoustic wave resonator, comprising:
a support part disposed on a substrate;
a layer disposed on the support part, wherein an air cavity is formed between the support part, the substrate, and the layer; and
a frame extending along a boundary surface of the layer, within the air cavity, wherein a width of an upper surface of the frame is greater than a width of a lower surface of the frame, and wherein side surfaces of the frame connecting the upper surface and the lower surface to each other are inclined.

10. The bulk acoustic wave resonator of claim 9, wherein the layer comprises a resonant part comprising a first electrode, a piezoelectric layer, and a second electrode.

11. The bulk acoustic wave resonator of claim 10, wherein the frame extends along the boundary surface, within the air cavity, in contact with the support part in an inactive region of the resonant part.

12. The bulk acoustic wave resonator of claim 10, wherein the frame extends along the boundary surface, within the air cavity, in contact with the support part at an edge of an active region of the resonant part.

13. The bulk acoustic wave resonator of claim 10, wherein the layer further comprises a membrane disposed between the resonant part and the air cavity.

14. The bulk acoustic wave resonator of claim 13, wherein the support part comprises a first support part and a second support part sequentially disposed in a direction away from the air cavity; and
the membrane is further disposed at a boundary between the air cavity and the frame, a boundary between the air cavity and the first support part, a boundary between the first support part and the second support part, a boundary between the frame and the second support part, and an upper surface of the second support part.

15. The bulk acoustic wave resonator of claim 9, wherein the support part comprises a first support part and a second support part sequentially disposed in a direction away from the air cavity, and wherein the first support part is formed of a material that is different than a material of the second support part.

16. The bulk acoustic wave resonator of claim 15, wherein the frame extends along the boundary surface, within the air cavity, and penetrates through portions of the first support part and the second support part.

17. The bulk acoustic wave resonator of claim 15, wherein a thickness of the first support part and a thickness of the second support part are the same as a thickness of the air cavity.

18. The bulk acoustic wave resonator of claim 9, wherein an angle formed by the lower surface and the side surface is 110° to 160°.

19. A bulk acoustic wave resonator, comprising:
a support part disposed on a substrate;
a resonant part disposed on the support part;
an air cavity disposed between the support part, the substrate, and the resonant part; and
a frame extending on a boundary surface of the resonant part, within the air cavity, and spaced apart from the support part.

* * * * *